United States Patent
Soell et al.

(10) Patent No.: US 12,283,928 B2
(45) Date of Patent: Apr. 22, 2025

(54) OPERATIONAL AMPLIFIER FOR USE IN COULOMB COUNTER CIRCUIT

(71) Applicant: Cirrus Logic International Semiconductor Ltd., Edinburgh (GB)

(72) Inventors: Sven Soell, Edinburgh (GB); Paul Wilson, Linlithgow (GB); James T. Deas, Edinburgh (GB); Axel Thomsen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 535 days.

(21) Appl. No.: 17/586,111

(22) Filed: Jan. 27, 2022

(65) Prior Publication Data
US 2022/0385252 A1 Dec. 1, 2022

Related U.S. Application Data

(60) Provisional application No. 63/193,282, filed on May 26, 2021.

(51) Int. Cl.
*H03F 3/45* (2006.01)
*H03M 1/66* (2006.01)

(52) U.S. Cl.
CPC .......... *H03F 3/45475* (2013.01); *H03M 1/66* (2013.01); *H03F 2200/165* (2013.01); *H03F 2200/459* (2013.01)

(58) Field of Classification Search
CPC ........... H03F 3/45475; H03F 2200/165; H03F 2200/459; H03F 3/005; H03F 3/45923;
(Continued)

(56) References Cited

U.S. PATENT DOCUMENTS 8,786,363 B2 * 7/2014 Ahmad ............... H03F 3/45475
330/69
9,178,530 B2 * 11/2015 Mitani ..................... H04B 1/44

FOREIGN PATENT DOCUMENTS

WO 2010021069 A1 2/2010

OTHER PUBLICATIONS

International Search Report and Written Opinion of the International Searching Authority, International Application No. PCT/US2022/028495, mailed Aug. 26, 2022.
(Continued)

*Primary Examiner* — Hieu P Nguyen
(74) *Attorney, Agent, or Firm* — Jackson Walker L.L.P.

(57) ABSTRACT

A circuit may include a two-stage feedforward compensated operational transconductance integrated amplifier, and the two-stage feedforward compensated operational transconductance integrated amplifier may include an input terminal, an output terminal, a signal path between the input terminal and the output terminal, the signal path comprising a first signal path gain stage and a second signal path gain stage, and ripple rejection circuitry coupled between the input terminal and an intermediate node of the signal path located between the first signal path gain stage and the second signal path gain stage. The ripple rejection circuitry may include a first ripple rejection circuitry gain stage coupled at its input to the input terminal and coupled at its output to an input terminal of a chopper circuit, a notch filter coupled at its input to an output terminal of the chopper circuit, and a second ripple rejection circuitry gain stage coupled at its input to an output terminal of the notch filter and coupled at its output to the intermediate node.

12 Claims, 11 Drawing Sheets

(58) Field of Classification Search
CPC .......... H03M 1/66; H03M 3/34; H03M 3/344; H03M 3/452; H03M 3/458
USPC ................................................ 330/252–261
See application file for complete search history.

(56) References Cited

OTHER PUBLICATIONS

Silva, J., et al.: "Wideband low-distortion detla-sigma ADC topology", Electronics Letters, the Institution of Engineering and Technology, GB, vol. 37, No. 12, Jun. 7, 2001, pp. 737-738.
Kusuda, Yoshinori, "A 5.9nV/√Hz chopper operational amplifier with 0.78µV maximum offset and 28.3nV/° C. offset drift", ISSCC 2011, Feb. 22, 2011.
Van Vroonhoven, Caspar, "23.3 A 0-to-60V-Input VCM Coulomb Counter with Signal-Dependent Supply Current and +0.5% Gain Inaccuracy from −50° C. to 125° C.", ISSCC 2020, Feb. 19, 2020.
Huijsing, Johan, Operational Amplifiers, Theory and Design, Third Edition, p. 374, Springer International Publishing Switzerland 2017.
Pavan, Shanthi and Sankar, Prabu, Power Reduction in Continuous-Time Delta-Sigma Modulators Using the Assisted Opamp Technique, IEEE Journal of Solid-State Circuits, vol. 45, No. 7, Jul. 2010.
Burt, Rod and Zhang, Joy, A Micropower Chopper-Stabilized Operational Amplifier Using a SC Notch Filter with Synchronous Integration Inside the Continuous-Time Signal Path, IEEE Journal of Solid-State Circuits, vol. 41, No. 12, Dec. 2006.

\* cited by examiner

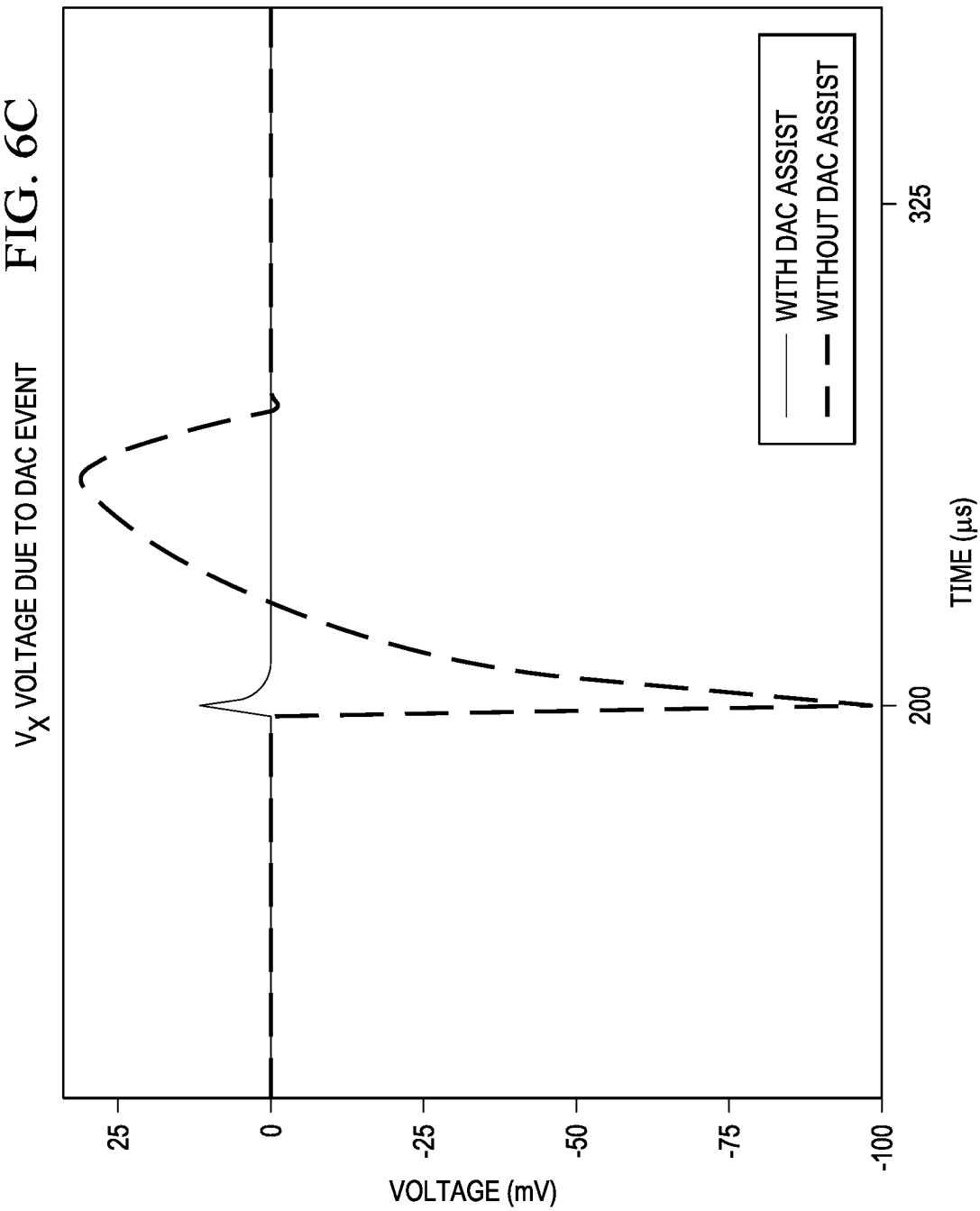

uter, as is known in the art. As shown in FIG. 1, a coulomb counter 1 may include a sense resistor 2 for measuring a sense voltage $V_{SNS}$ which is indicative of an electrical current $I_{SNS}$ flowing through the sense resistor. For example, electrical current $I_{SNS}$ may comprise a current drawn from a battery. As also shown in FIG. 1, coulomb counter 1 may include an integrator 4 implemented in part with an amplifier 6, such integrator 4 configured to integrate electrical current $I_{SNS}$ over time, providing an indication of net electrical charge that has flowed through sense resistor 2. To prevent integrator saturation, a quantum of charge may be subtracted from integrator 4 using a feedback path having a gain element 50, which may be implemented in whole or part with a digital-to-analog converter (DAC). These feedback events may be counted by a digital accumulator 20 and the result may be a digital quantity Q proportional to the input sense charge flowing through sense resistor 2. Thus, if sense resistor 2 is coupled to the output of a battery, coulomb counter 1 may calculate a net electrical charge drawn from the battery.

As also shown in FIG. 1, coulomb counter 1 may implement both system-level chopping using chopping blocks 8 and block-level chopping within integrator 4, using chopping blocks 10. Block-level chopping blocks 10 may operate at a first chopping frequency (e.g., one-half the sampling frequency $F_s$ of coulomb counter 1) to reduce DC offset and inverse frequency noise (also known as 1/f noise) of amplifier 6, and system-level chopping blocks 8 may operate at a# OPERATIONAL AMPLIFIER FOR USE IN COULOMB COUNTER CIRCUIT

RELATED APPLICATION

The present disclosure claims priority to U.S. Provisional Patent Application Ser. No. 63/193,282, filed May 26, 2021, which is incorporated by reference herein in its entirety.

FIELD OF DISCLOSURE

The present disclosure relates in general to circuits for electronic devices, including without limitation personal portable devices such as wireless telephones and media players, and more specifically, to an operational amplifier that may be used within a coulomb counter circuit.

BACKGROUND

Portable electronic devices, including wireless telephones, such as mobile/cellular telephones, tablets, cordless telephones, mp3 players, and other consumer devices, are in widespread use. Such portable electronic devices are often powered by a battery (e.g., a lithium-ion battery). In battery-powered devices, it is often desirable to measure an amount of electrical charge drawn from a battery and delivered to the battery, which may be used to determine a state of charge of the battery.

A circuit referred to as a coulomb counter may be used to measure an amount of electrical charge drawn from a battery and delivered to the battery. In operation, a coulomb counter may detect an electrical current flowing in and out of the battery and integrate such current continuously over time, in order to calculate a total electrical charge drawn from and delivered to the battery. Because coulomb counters continuously integrate, extremely low direct-current (DC) offset in coulomb counter circuitry is desired.

FIG. 1 illustrates a block diagram of an example coulomb counter, as is known in the art. As shown in FIG. 1, a coulomb counter 1 may include a sense resistor 2 for measuring a sense voltage $V_{SNS}$ which is indicative of an electrical current $I_{SNS}$ flowing through the sense resistor. For example, electrical current $I_{SNS}$ may comprise a current drawn from a battery. As also shown in FIG. 1, coulomb counter 1 may include an integrator 4 implemented in part with an amplifier 6, such integrator 4 configured to integrate electrical current $I_{SNS}$ over time, providing an indication of net electrical charge that has flowed through sense resistor 2. To prevent integrator saturation, a quantum of charge may be subtracted from integrator 4 using a feedback path having a gain element 50, which may be implemented in whole or part with a digital-to-analog converter (DAC). These feedback events may be counted by a digital accumulator 20 and the result may be a digital quantity Q proportional to the input sense charge flowing through sense resistor 2. Thus, if sense resistor 2 is coupled to the output of a battery, coulomb counter 1 may calculate a net electrical charge drawn from the battery.

As also shown in FIG. 1, coulomb counter 1 may implement both system-level chopping using chopping blocks 8 and block-level chopping within integrator 4, using chopping blocks 10. Block-level chopping blocks 10 may operate at a first chopping frequency (e.g., one-half the sampling frequency $F_s$ of coulomb counter 1) to reduce DC offset and inverse frequency noise (also known as 1/f noise) of amplifier 6, and system-level chopping blocks 8 may operate at a second chopping frequency (e.g., $F_s/512$) to provide residual DC offset for coulomb counter 1.

In summary, coulomb counter 1 may essentially comprise a discrete-time input, switched capacitor feedback sigma-delta modulator. The switched capacitor feedback sigma-delta modulator may receive voltage at its input and generate a pulse-density modulated signal at its output which has a period proportional to the voltage at the input. However, architectures using a continuous time input may also be used.

For better clarity, coulomb counter 1 depicted in FIG. 1 may be represented as a signal processing block diagram as shown in FIG. 2. As shown in FIG. 2, system-level chopping blocks 8 are represented as mixers 12, each having a chopping frequency $f_{chsys}$, at the input and output of a sigma-delta analog to digital converter (ADC) 14 that comprises integrator 4 and a three-level quantizer 16. Block-level chopping blocks 10 are not depicted in FIG. 2.

Coulomb counter 1 as shown in FIGS. 1 and 2 may have disadvantages. Among such disadvantages are an elevated quantization error, offset voltages, and/or ripple voltages. To illustrate, coulomb counter 1 depicted in FIG. 1 may be represented by the circuit diagram of FIG. 3A, in which system-level chopping blocks 8, block-level chopping blocks 10, and one or more other components are not depicted for purposes of clarity and exposition. As shown in FIG. 3A, coulomb counter 1 may be implemented as an anti-aliasing filter that filters sense voltage $V_{SNS}$, an integrator comprising two-stage feedforward-compensated operational transconductance amplifier (FFCOTA) 6 and an integrating capacitor having capacitance $C_{int}$, followed by a 3-level quantizer 16 and an accumulator 20. As shown in FIG. 3A, coulomb counter 1 may also include a feedback path with a feedback gain element 50 which may be implemented in whole or part with a DAC.

As shown in FIG. 3B, the anti-aliasing filter may be implemented using a resistive voltage divider and an anti-aliasing capacitor. Further as shown in FIG. 3B, two-stage FFCOTA 6 may include a negative gain stage of gain—$g_{m1}$ followed by a gain stage of gain $g_{m2}$. In parallel with the series combination of gains—$g_{m1}$ and $g_{m2}$ may be a feedforward gain—$g_{m3}$. Inputs to each of the respective gain stages may be chopped by a respective chopper 30, 32, and 34. A disadvantage of the architecture shown in FIG. 3B may be the presence of an offset ripple voltage at the input terminal of two-stage FFCOTA 6.

Approaches that overcome such disadvantages are desired.

SUMMARY

In accordance with the teachings of the present disclosure, certain disadvantages and problems associated with existing sensor systems may be reduced or eliminated.

In accordance with embodiments of the present disclosure, a circuit may include a two-stage feedforward compensated operational transconductance integrated amplifier, and the two-stage feedforward compensated operational transconductance integrated amplifier may include an input terminal, an output terminal, a signal path between the input terminal and the output terminal, the signal path comprising a first signal path gain stage and a second signal path gain stage, and ripple rejection circuitry coupled between the input terminal and an intermediate node of the signal path located between the first signal path gain stage and the second signal path gain stage. The ripple rejection circuitry may include a first ripple rejection circuitry gain stage coupled at its input to the input terminal and coupled at its output to an input terminal of a chopper circuit, a notch filter coupled at its input to an output terminal of the chopper circuit, and a second ripple rejection circuitry gain stage coupled at its input to an output terminal of the notch filter and coupled at its output to the intermediate node.

In accordance with these and other embodiments of the present disclosure, a circuit may include an amplifier comprising an input terminal and an output terminal, a filter having its output coupled to the input terminal, the filter configured to receive an input signal and generate a filtered input signal to the input terminal, a digital-to-analog converter having its output coupled to the input terminal, the digital-to-analog converter configured to receive a digital signal and generate an equivalent analog signal to the input terminal, and a signal assist path gain stage coupled at its input to the filter and coupled at its output to the output terminal and configured to inject a current from the filter into an integrating capacitor of the amplifier.

In accordance with these and other embodiments of the present disclosure, a circuit may include an amplifier comprising an input terminal and an output terminal, a filter having its output coupled to the input terminal, the filter configured to receive an input signal and generate a filtered input signal to the input terminal; a digital-to-analog converter having its output coupled to the input terminal, the digital-to-analog converter configured to receive a digital signal and generate an equivalent analog signal to the input terminal; a replica digital-to-analog converter identical to the digital-to-analog converter; and a DAC assist path gain stage coupled at its input to an output of the replica digital-to-analog converter and at its output to the output terminal and configured to inject a current from the DAC assist gain stage into the output terminal.

In accordance with these and other embodiments of the present disclosure, a method may include, in a two-stage feedforward compensated operational transconductance integrated amplifier, the two-stage feedforward compensated operational transconductance integrated amplifier comprising an input terminal, an output terminal, and a signal path between the input terminal and the output terminal, and the signal path having a first signal path gain stage and a second signal path gain stage, coupling ripple rejection circuitry between the input terminal and an intermediate node of the signal path located between the first signal path gain stage and the second signal path gain stage. The ripple rejection circuitry may include a first ripple rejection circuitry gain stage coupled at its input to the input terminal and coupled at its output to an input terminal of a chopper circuit, a notch filter coupled at its input to an output terminal of the chopper circuit, and a second ripple rejection circuitry gain stage coupled at its input to an output terminal of the notch filter and coupled at its output to the intermediate node.

In accordance with these and other embodiments of the present disclosure, a method may include coupling a filter at its output coupled to an input terminal of an amplifier, wherein the filter is configured to receive an input signal and generate a filtered input signal to the input terminal, coupling a digital-to-analog converter at its output coupled to the input terminal, wherein the digital-to-analog converter is configured to receive a digital signal and generate an equivalent analog signal to the input terminal, and coupling a signal assist path gain stage at its input to the filter and coupling the signal assist path gain stage at its output to an output terminal of the amplifier, wherein the signal assist path gain stage is configured to inject a current from the filter into an integrating capacitor of the amplifier.

In accordance with these and other embodiments of the present disclosure, a method may include coupling a filter at its output to an input terminal of an amplifier, wherein the filter is configured to receive an input signal and generate a filtered input signal to the input terminal; coupling a digital-to-analog converter at its output to the input terminal, wherein the digital-to-analog converter is configured to receive a digital signal and generate an equivalent analog signal to the input terminal; and coupling a DAC assist path gain stage at its input to an output of a replica digital-to-analog converter identical to the digital-to-analog converter and coupling the DAC assist path at its output to the output terminal, wherein the DAC assist path is configured to inject a current from the DAC assist gain stage into the output terminal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein:

FIG. 6C illustrates a graph depicting an example advantage of including the gain stage shown in FIGS. 6A and 6B, in accordance with embodiments of the present disclosure.

DETAILED DESCRIPTION

Figure 1:
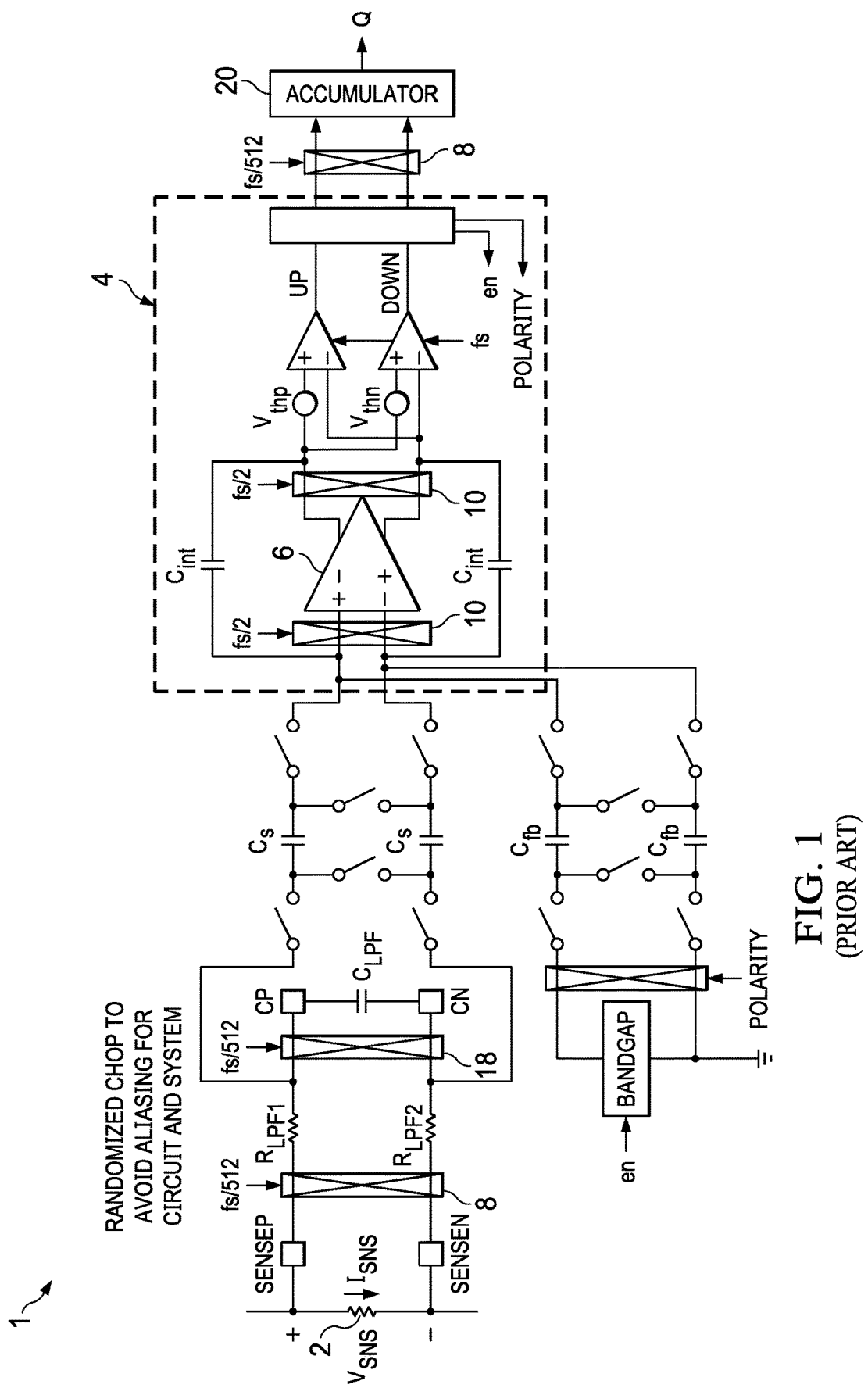
FIG. 1 illustrates a circuit diagram of selected components of a coulomb counter, as is known in the art.
Figure 2:
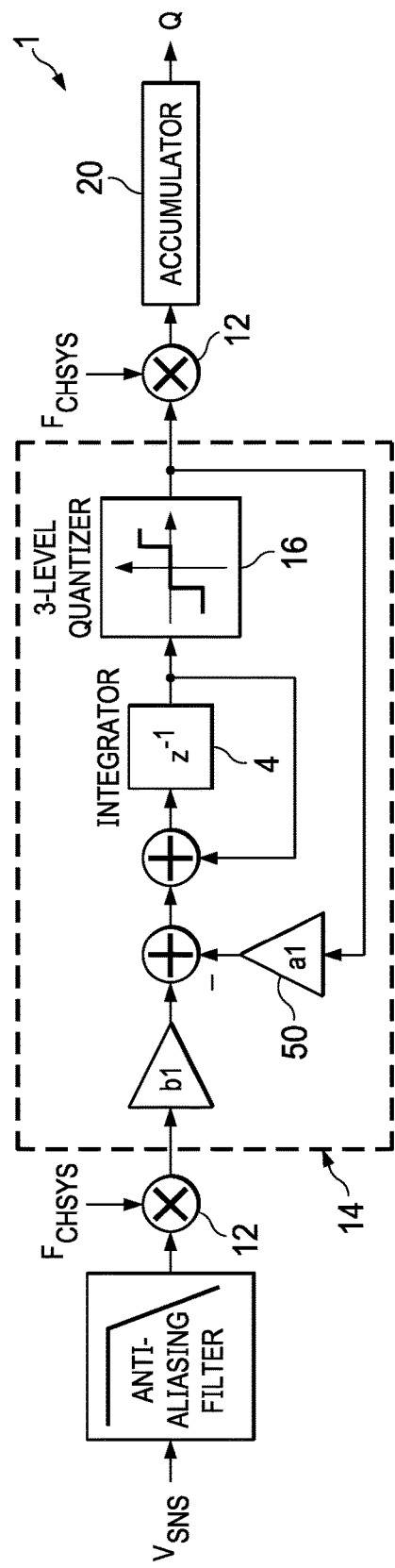
FIG. 2 illustrates a block diagram of the coulomb counter of FIG. 1, as is known in the art.
Figure 3A:
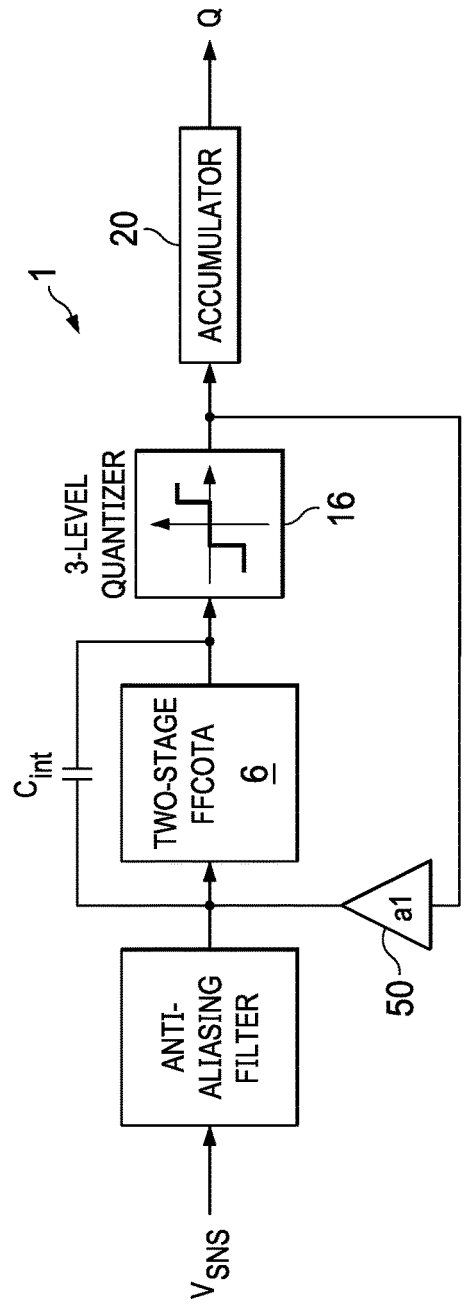
FIG. 3A illustrates a simplified circuit diagram of the coulomb counter of FIG. 1, as is known in the art.
Figure 3B:
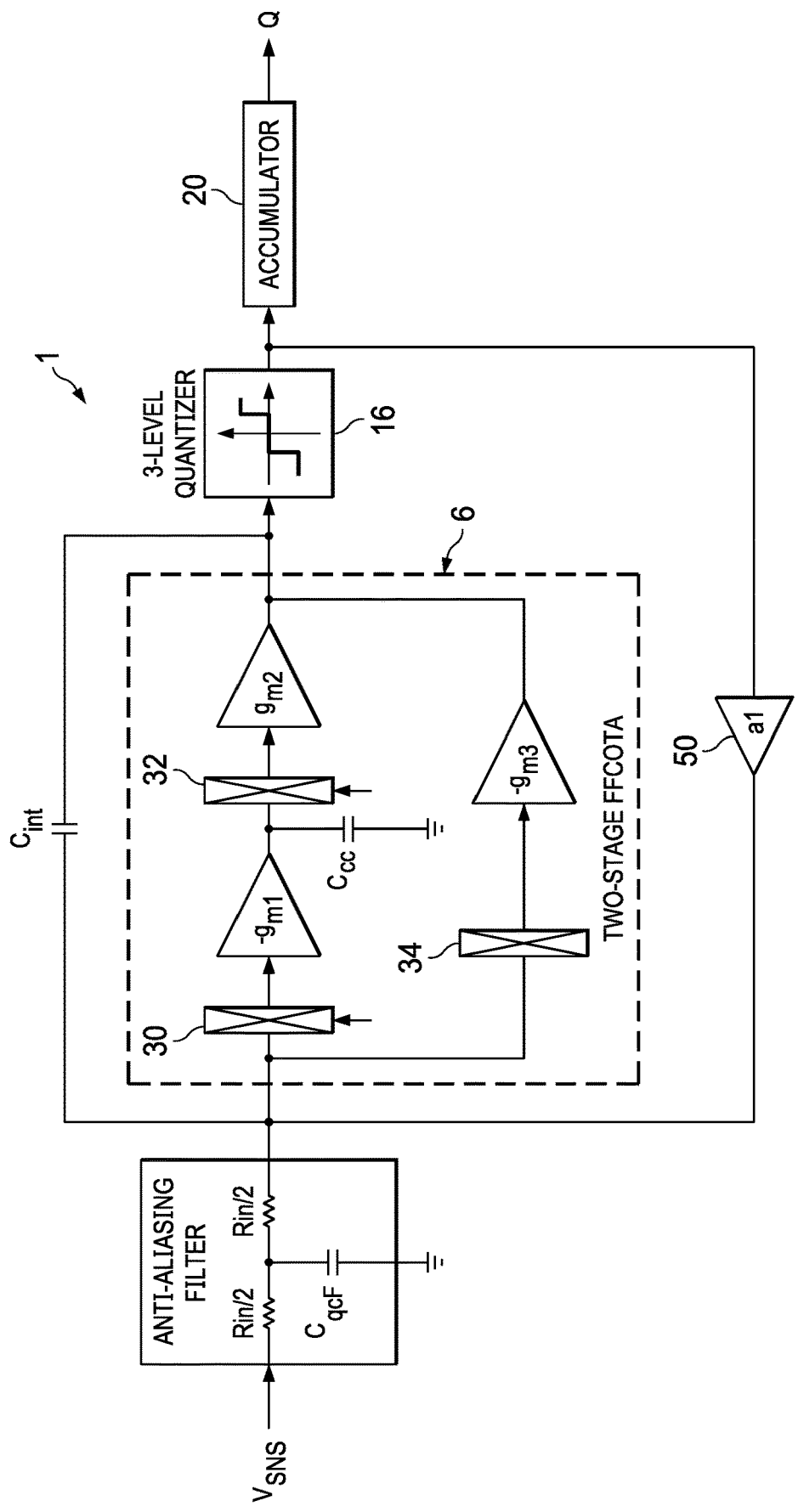
FIG. 3B illustrates the simplified circuit diagram of the coulomb counter of FIG. 3A, with detail shown of an anti-aliasing filter and operational amplifier, as is known in the art.
Figure 4A:
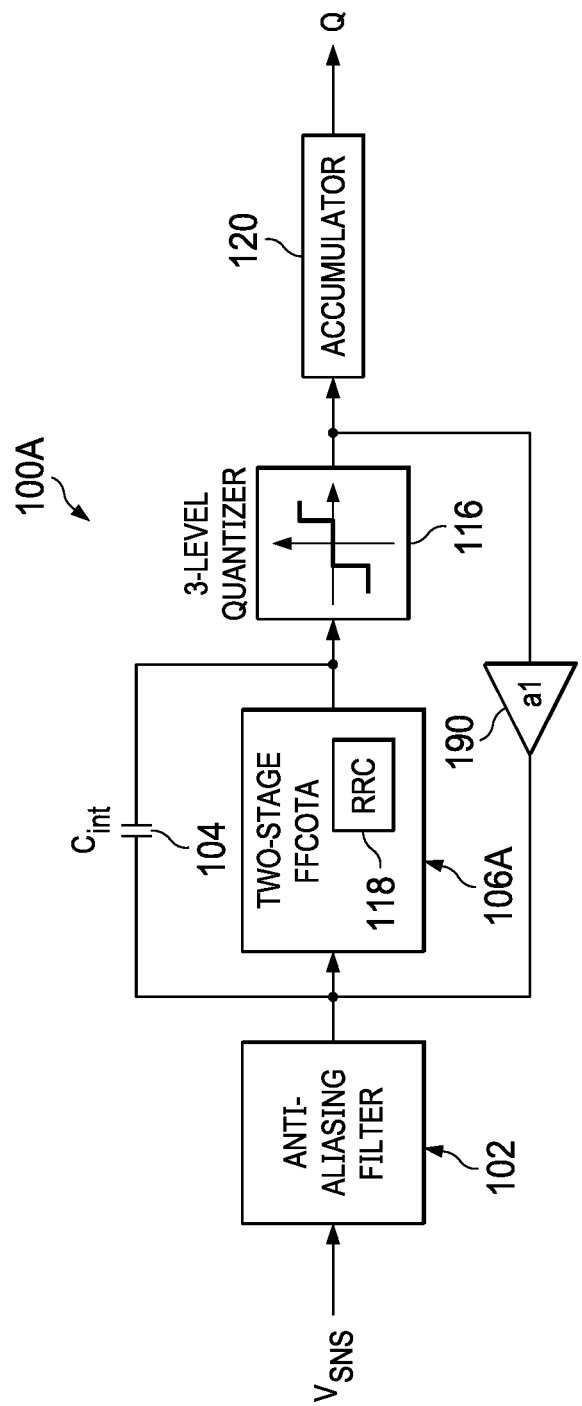
FIG. 4A illustrates a block diagram of an example coulomb counter, in accordance with embodiments of the present disclosure.

FIG. 4A illustrates a block diagram of an example coulomb counter 100A, in accordance with embodiments of the present disclosure. In some embodiments, coulomb counter 100A may be implemented within a portable electronic device, such as a smart phone, tablet, game controller, and/or other suitable device. As shown in FIG. 4A, coulomb counter 100A may include an anti-aliasing filter 102, an integrator comprising a two-stage FFCOTA 106A and an integrating capacitor 104, a 3-level quantizer 116, an accumulator 120, and a feedback path comprising a gain element 190, wherein such gain element may be implemented with a DAC.

Anti-aliasing filter 102 may be located at the input of coulomb counter 100A and may be configured to filter an input signal to coulomb counter 100A indicative of an electrical current (e.g., a sensed voltage across a sense resistor).

A sigma-delta analog-to-digital converter (ADC) may in effect be implemented by a two-stage FFCOTA 106A and integrating capacitor 104, a 3-level quantizer 116, and a feedback path comprising gain element 190, such ADC operable to convert an analog signal received at its input to an equivalent digital signal at its output. Accumulator 120 may receive the quantized digital output signal generated by 3-level quantizer 116 and digitally integrate the quantized digital output signal over time to calculate a net amount of charge Q flowing through the sense resistor from which the input of coulomb counter 100A is obtained.

As shown in FIG. 4A, two-stage FFCOTA 106A may include ripple reduction circuitry (RRC) 118. RRC 118 is described in greater detail below with respect to FIG. 4B.

Figure 4B:
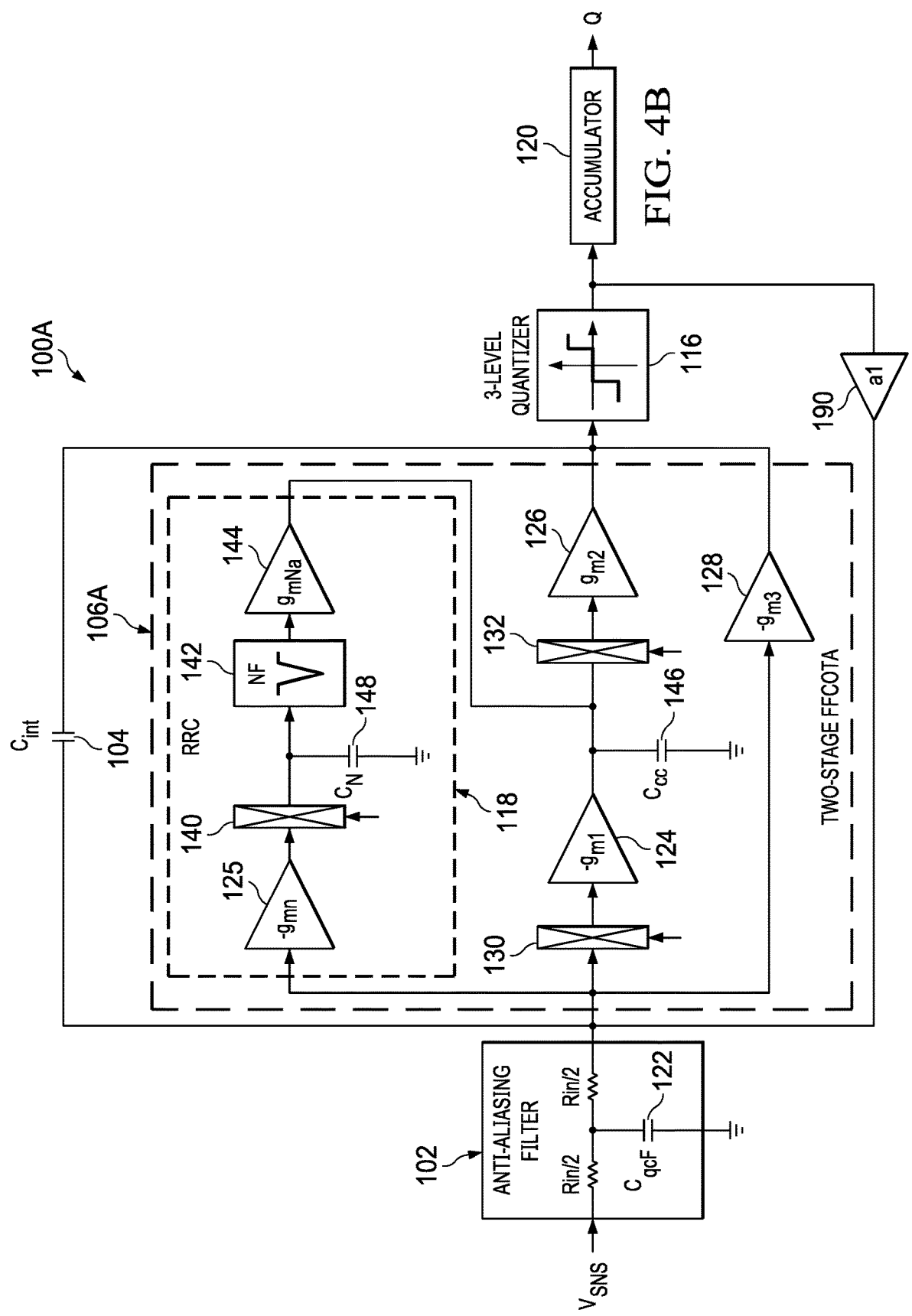
FIG. 4B illustrates the simplified circuit diagram of the coulomb counter of FIG. 4A, with detail shown of an anti-aliasing filter and an operational amplifier, in accordance with embodiments of the present disclosure.

FIG. 4B illustrates a circuit diagram of the coulomb counter 100A, with detail shown of anti-aliasing filter 102 and two-stage FFCOTA 106A, in accordance with embodiments of the present disclosure. As shown in FIG. 4B, anti-aliasing filter 102 may be implemented using a resistive voltage divider (e.g., resistors each having resistances of $R_{in}/2$) and an anti-aliasing capacitor 122. Further as shown in FIG. 4B, two-stage FFCOTA 106A may include a negative gain stage 124 with gain—$g_{m1}$ followed by a gain stage 126 having gain $g_{m2}$. In parallel with the series combination of gain stages 124 and 126 is a feedforward gain stage 128 having gain—$g_{m3}$. An input to gain stage 124 may be chopped by a chopper 130 and an input to gain stage 126 may be unchopped by chopper 132.

As mentioned above, FFCOTA 106A may include RRC 118. As shown in FIG. 4B, RRC 118 may include a negative gain stage 125 with gain—$g_{mn}$, followed by a chopper 140, a notch filter 142, and a gain stage 144 having gain $g_{mNa}$. Accordingly, RRC 118 may effectively serve as a chopped ripple reduction servo which may monitor a voltage present at the input of negative gain stage 124 and may remove offset voltage (and its associated ripple) present at the input of negative gain stage 124 by injecting a compensating current into the output terminal of negative gain stage 124, to which capacitor 146 may be coupled. Because the chopped ripple reduction servo has offset voltages associated with itself, its output signal may also be chopped by chopper 140. Chopper 140 may serve to mix input signal ripple down to direct current, and mix up the unwanted offset of negative gain stage 125. Further, notch filter 142 and capacitor 148 may attenuate any undesired signal components, thus filtering out any residual ripple.

Figure 5A:
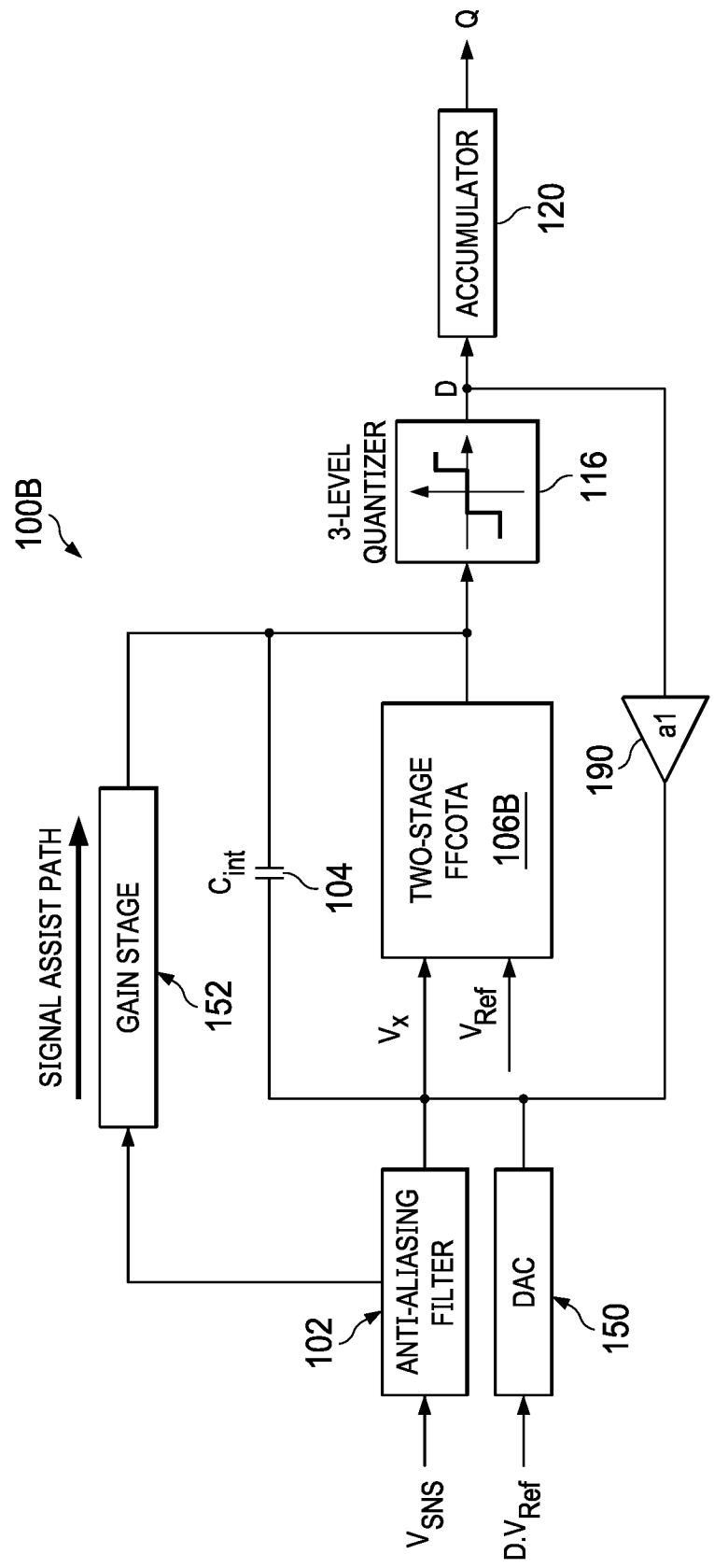
FIG. 5A illustrates a block diagram of an example coulomb counter, in accordance with embodiments of the present disclosure.

FIG. 5A illustrates a block diagram of an example coulomb counter 100B, in accordance with embodiments of the present disclosure. In some embodiments, coulomb counter 100B may be implemented within a portable electronic device, such as a smart phone, tablet, game controller, and/or other suitable device. As shown in FIG. 5A, coulomb counter 100B may include an anti-aliasing filter 102, an integrator comprising a two-stage FFCOTA 106B and an integrating capacitor 104, a 3-level quantizer 116, a feedback path comprising a gain element 190 (which may be implemented using a DAC), an accumulator 120, a signal assist path comprising a gain stage 152, and a feedback digital-to-analog converter (DAC) 150.

Anti-aliasing filter 102 may be located at the input of coulomb counter 100B and may be configured to filter an input signal to coulomb counter 100B indicative of an electrical current (e.g., a sensed voltage across a sense resistor).

A sigma-delta analog-to-digital converter (ADC) may in effect be implemented by a two-stage FFCOTA 106B and integrating capacitor 104, and a 3-level quantizer 116, such ADC operable to convert an analog signal received at its input to an equivalent digital signal at its output. Accumulator 120 may receive the quantized digital output signal generated by 3-level quantizer 116 and digitally integrate the quantized digital output signal over time to calculate a net amount of charge Q flowing through the sense resistor from which the input of coulomb counter 100B is obtained.

Figure 5B:
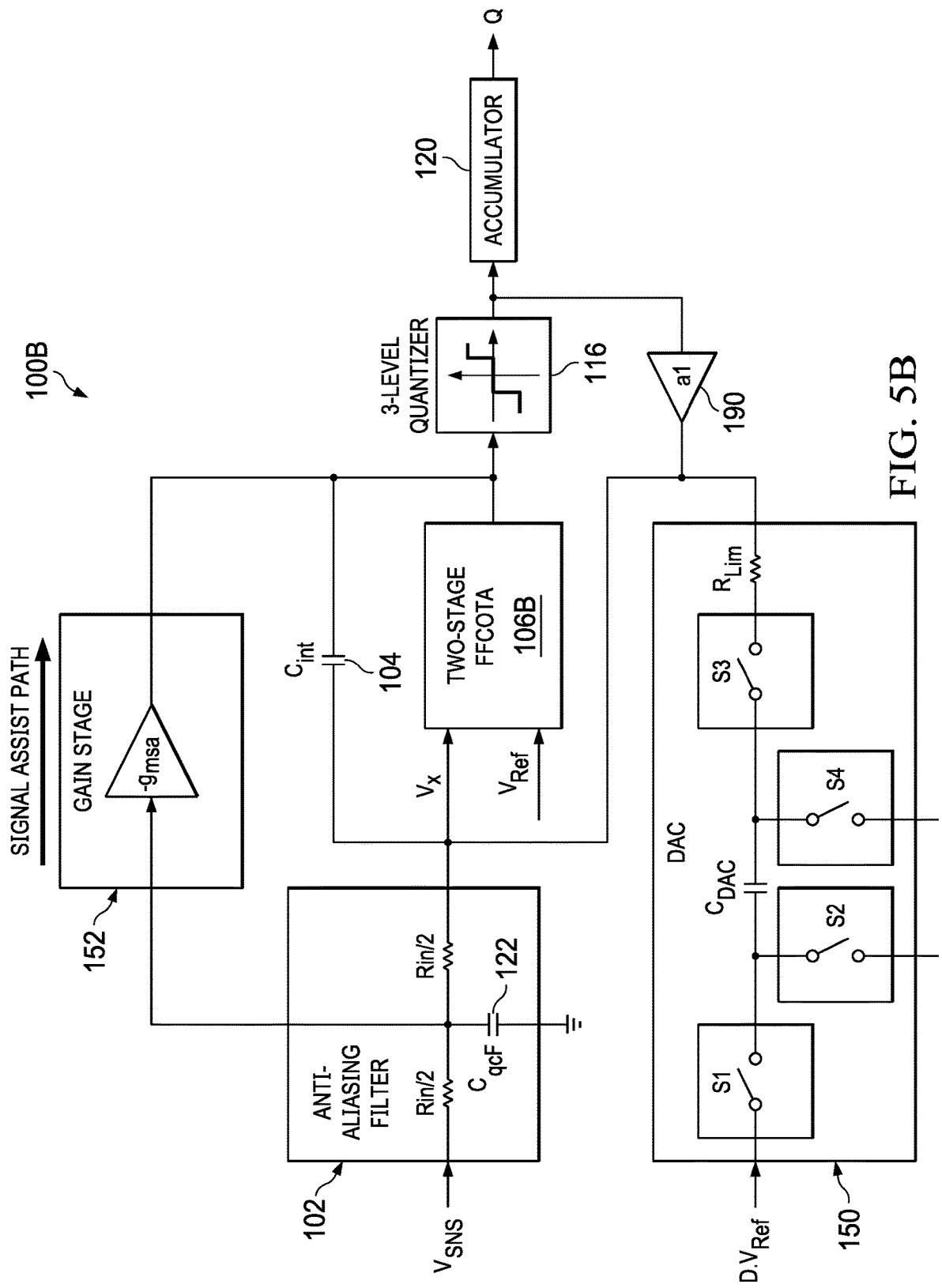
FIG. 5B illustrates the simplified circuit diagram of the coulomb counter of FIG. 5A, with detail shown of an anti-aliasing filter, gain stage, and feedback digital-to-analog converter, in accordance with embodiments of the present disclosure.

FIG. 5B illustrates a circuit diagram of the coulomb counter 100B, with detail shown of anti-aliasing filter 102, gain stage 152, and feedback digital-to-analog converter 150, in accordance with embodiments of the present disclosure. As shown in FIG. 5B, anti-aliasing filter 102 may be implemented using a resistive voltage divider (e.g., resistors each having resistances of $R_{in}/2$) and an anti-aliasing capacitor 122. Further, although not explicitly shown in FIG. 4B, two-stage FFCOTA 106B may be similar in topology to two-stage FFCOTA 106A. Thus, two-stage FFCOTA 106B may include a negative gain stage 124 with gain—$g_{m1}$ followed by a gain stage 126 having gain $g_{m2}$, may include in parallel with the series combination of gain stages 124 and 126 a feedforward gain stage 128 having gain—$g_{m3}$, and may include respective choppers 130 and 132 for chopping and unchopping signals at inputs to each of the respective gain stages 124 and 126. In some embodiments, RRC 118 present in two-stage FFCOTA 106A may be absent from two-stage FFCOTA 106B. In other embodiments, RRC 118 present in two-stage FFCOTA 106A may also be present in two-stage FFCOTA 106B, such that two-stage FFCOTA 106A may be identical to two-stage FFCOTA 106B in such embodiments.

Gain stage 152 may have a gain equal to negative gain—$g_{msa}$ and may be coupled between the midpoint of the voltage divider of anti-aliasing filter 102 and the output terminal of two-stage FFCOTA 106B, forming a signal assist path such that the current that would otherwise flow into the input terminal of two-stage FFCOTA 106B (via one of the resistors of anti-aliasing filter 102) and contribute to a voltage $V_x$ present at the input terminal of two-stage FFCOTA 106B, may instead be supplied to the output of two-stage FFCOTA 106B via such signal assist path. Negative gain—$g_{msa}$ may be equal to ½Rin, wherein Rin is twice the value of the resistances present in anti-aliasing filter 102.

Such signal assist path may inject a current with value equal to the current flowing in a resistor of anti-aliasing filter 102, such that two-stage FFCOTA 106B need not provide such current via integrating capacitor 104. As a result, the virtual ground node $V_x$ may have no presence of sense voltage $V_{SNS}$.

Feedback DAC 150 may receive a digital input signal $D.V_{Ref}$, and may convert such digital input signal $D.V_{Ref}$ into analog equivalent reference voltage injected into voltage $V_x$. Digital input signal $D.V_{Ref}$ may be a digital representation of a reference voltage $V_{Ref}$ input to a second input terminal of two-stage FFCOTA 106B (wherein such reference voltage $V_{Ref}$ may be a ground potential in some embodiments), multiplied by the quantized output D of 3-level quantizer 116 (e.g., D may equal −1, 0, or +1). DAC 150 may serve to convert digital input signal $D.V_{Ref}$ into an analog charge of value $D.V_{Ref}C_{int}$, and add such charge to the integrator of coulomb counter 100B.

Figure 6A:
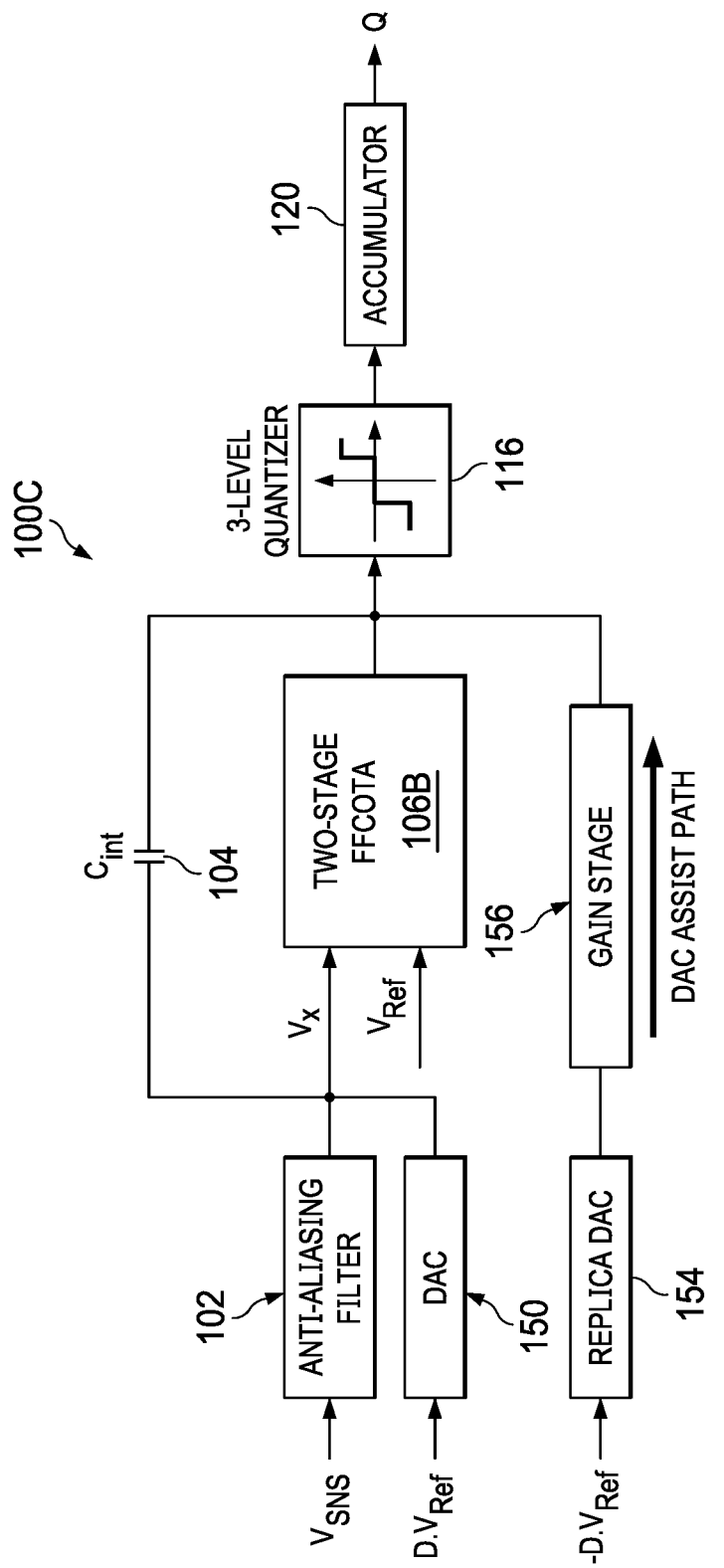
FIG. 6A illustrates a block diagram of an example coulomb counter, in accordance with embodiments of the present disclosure.
Figure 6B:
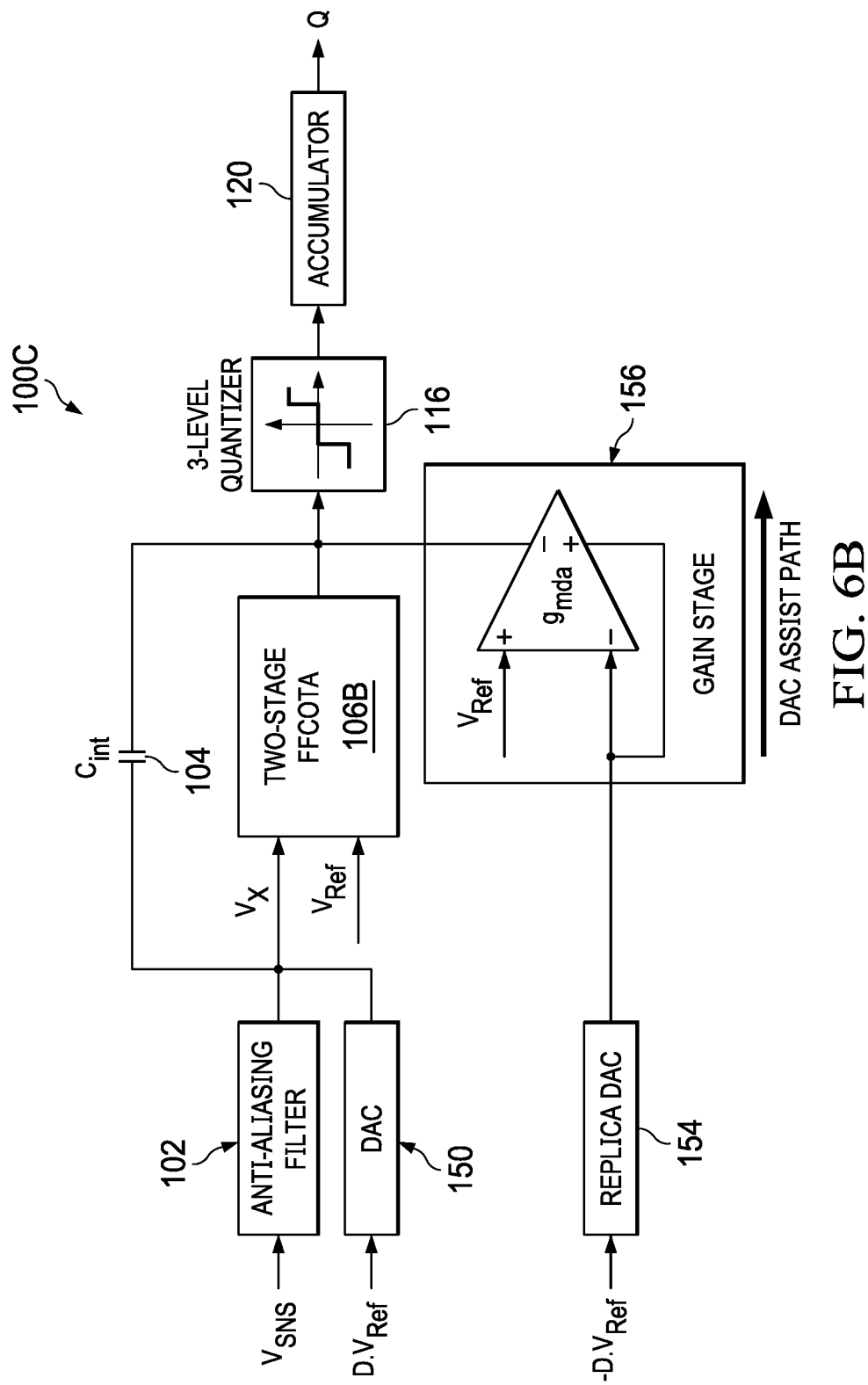
FIG. 6B illustrates the simplified circuit diagram of the coulomb counter of FIG. 6A, with detail shown of a gain stage, in accordance with embodiments of the present disclosure.

FIG. 6A illustrates a block diagram of an example coulomb counter 100C, in accordance with embodiments of the present disclosure. In some embodiments, coulomb counter 100C may be implemented within a portable electronic device, such as a smart phone, tablet, game controller, and/or other suitable device. As shown in FIG. 6A, coulomb counter 100C may include an anti-aliasing filter 102, an integrator comprising a two-stage FFCOTA 106B and an integrating capacitor 104, a 3-level quantizer 116, an accumulator 120, a signal assist path comprising a gain stage 156, a feedback digital-to-analog converter (DAC) 150, and a replica DAC 154. Coulomb counter 100C may be similar in many respects to coulomb counter 100B, except that coulomb counter 100C includes gain stage 156 and replica DAC 154 in lieu of gain stage 152. FIG. 6B illustrates the simplified circuit diagram of coulomb counter 100C, with detail shown of gain stage 156 having a gain of—$g_{mda}$ (which may be the same as gain—$g_{mda}$ depicted in FIG. 5B) in accordance with embodiments of the present disclosure. As shown in FIG. 6B, gain stage 156 may be coupled between the output of replica DAC 154 and the output of two-stage FFCOTA 106B to form a DAC assist path. Replica DAC 154 may be identical to feedback DAC 150 with the exception that replica DAC 154 may receive an input which is the inverse of that received by feedback DAC 150.

In operation, gain stage 156 and replica DAC 154 may combine to generate, at the output of two-stage FFCOTA 106B, a current opposite to a current generated by DAC 150. Current generated by DAC 150 may pass through integrating capacitor 104 and sum with the node at the output of two-stage FFCOTA 106B with opposite current output by gain stage 156. Such combined currents may be approximately equal, and thus may minimize an output current required from two-stage FFCOTA 106B, thus minimizing disturbance at the electrical node of voltage $V_x$. Stated in another manner, the combination of replica DAC 154 and gain stage 156 may assist in lowering an apparent impedance at the output of two-stage FFCOTA 106B, meaning two-stage FFCOTA 106B may have to do less "work" to supply current at its output, minimizing disturbance at the electrical node of voltage $V_x$. FIG. 6C illustrates a graph depicting an example advantage of including the DAC assist path shown in FIGS. 6A and 6B, in accordance with embodiments of the present disclosure.

Figure 7:
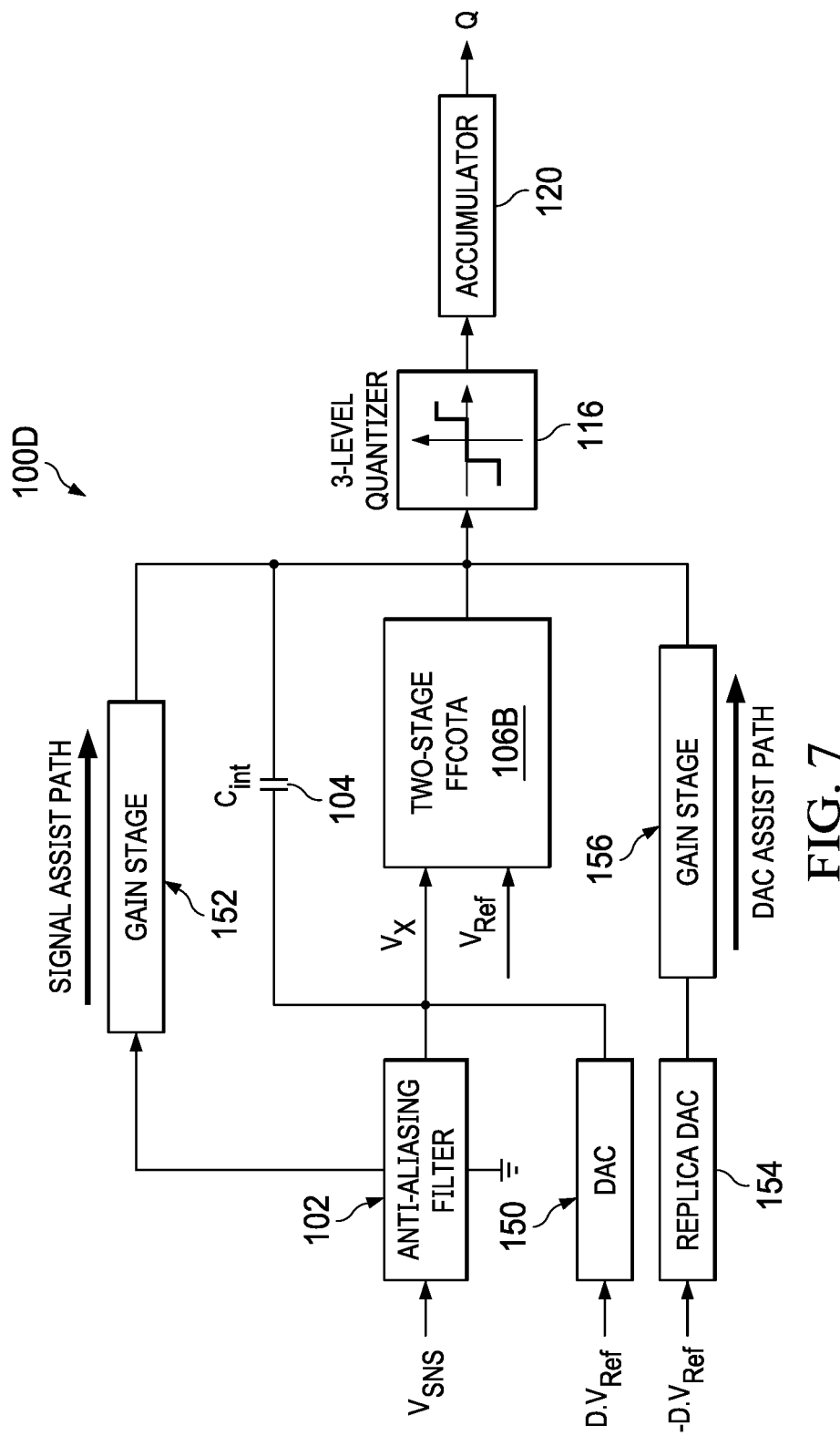
FIG. 7 illustrates a block diagram of an example coulomb counter, in accordance with embodiments of the present disclosure.

FIG. 7 illustrates a block diagram of an example coulomb counter 100D, in accordance with embodiments of the present disclosure. As shown in FIG. 7, coulomb counter 100D combines the features of coulomb counter 100B and coulomb counter 100C, thus providing advantages of both coulomb counter 100B and coulomb counter 100C. In some embodiments, coulomb counter 100D may be implemented with two-stage FFCOTA 106A comprising RRC 118 in lieu of two-stage FFCOTA 106B, thus also providing the advantages of RRC 118.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A circuit comprising a two-stage feedforward compensated operational transconductance integrated amplifier, the two-stage feedforward compensated operational transconductance integrated amplifier comprising:
   an input terminal;
   an output terminal;
   a signal path between the input terminal and the output terminal, the signal path comprising a first signal path gain stage and a second signal path gain stage; and
   ripple rejection circuitry coupled between the input terminal and an intermediate node of the signal path located between the first signal path gain stage and the second signal path gain stage, the ripple rejection circuitry comprising:
      a first ripple rejection circuitry gain stage coupled at its input to the input terminal and coupled at its output to an input terminal of a chopper circuit;
      a notch filter coupled at its input to an output terminal of the chopper circuit; and
      a second ripple rejection circuitry gain stage coupled at its input to an output terminal of the notch filter and coupled at its output to the intermediate node;
   a filter having its output coupled to the input terminal of the two-stage feedforward compensated operational transconductance integrated amplifier, the filter configured to receive an input signal and generate a filtered input signal to the input terminal of the two-stage feedforward compensated operational transconductance integrated amplifier;
   a digital-to-analog converter having its output coupled to the input terminal of the two-stage feedforward compensated operational transconductance integrated amplifier, the digital-to-analog converter configured to receive a digital signal and generate an equivalent analog signal to the input terminal of the two-stage feedforward compensated operational transconductance integrated amplifier; and
   a signal assist path gain stage coupled at its input to the filter and coupled at its output to the output terminal and configured to inject a current from the filter into an integrating capacitor of the two-stage feedforward compensated operational transconductance integrated amplifier.

2. The circuit of claim 1, further comprising:
   a replica digital-to-analog converter identical to the digital-to-analog converter; and
   a DAC assist path gain stage coupled at its input to an output of the replica digital-to-analog converter and at its output to the output terminal and configured to inject a current from the DAC assist gain stage into the output terminal of the two-stage feedforward compensated operational transconductance integrated amplifier.

3. A circuit comprising a two-stage feedforward compensated operational transconductance integrated amplifier, the two-stage feedforward compensated operational transconductance integrated amplifier comprising:
   an input terminal;
   an output terminal;
   a signal path between the input terminal and the output terminal, the signal path comprising a first signal path gain stage and a second signal path gain stage; and
   ripple rejection circuitry coupled between the input terminal and an intermediate node of the signal path located between the first signal path gain stage and the second signal path gain stage, the ripple rejection circuitry comprising:
      a first ripple rejection circuitry gain stage coupled at its input to the input terminal and coupled at its output to an input terminal of a chopper circuit;
      a notch filter coupled at its input to an output terminal of the chopper circuit; and
   a second ripple rejection circuitry gain stage coupled at its input to an output terminal of the notch filter and coupled at its output to the intermediate node;
   a filter having its output coupled to the input terminal of the two-stage feedforward compensated operational transconductance integrated amplifier, the filter configured to receive an input signal and generate a filtered input signal to the input terminal of the two-stage feedforward compensated operational transconductance integrated amplifier;
   a digital-to-analog converter having its output coupled to the input terminal of the two-stage feedforward compensated operational transconductance integrated amplifier, the digital-to-analog converter configured to receive a digital signal and generate an equivalent analog signal to the input terminal of the two-stage feedforward compensated operational transconductance integrated amplifier;
   a replica digital-to-analog converter identical to the digital-to-analog converter; and
   a DAC assist path gain stage coupled at its input to an output of the replica digital-to-analog converter and at its output to the output terminal and configured to inject a current from the DAC assist gain stage into the output terminal of the two-stage feedforward compensated operational transconductance integrated amplifier.

4. A circuit comprising:
   an amplifier comprising an input terminal and an output terminal;
   a filter having its output coupled to the input terminal, the filter configured to receive an input signal and generate a filtered input signal to the input terminal;
   a digital-to-analog converter having its output coupled to the input terminal, the digital-to-analog converter configured to receive a digital signal and generate an equivalent analog signal to the input terminal; and
   a signal assist path gain stage coupled at its input to the filter and coupled at its output to the output terminal and configured to inject a current from the filter into an integrating capacitor of the amplifier.

5. The circuit of claim 4, further comprising:
   a replica digital-to-analog converter identical to the digital-to-analog converter; and
   a DAC assist path gain stage coupled at its input to an output of the replica digital-to-analog converter and at its output to the output terminal and configured to inject a current from the DAC assist gain stage into the output terminal.

6. A circuit comprising:
   an amplifier comprising an input terminal and an output terminal;
   a filter having its output coupled to the input terminal, the filter configured to receive an input signal and generate a filtered input signal to the input terminal;
   a digital-to-analog converter having its output coupled to the input terminal, the digital-to-analog converter configured to receive a digital signal and generate an equivalent analog signal to the input terminal;
a replica digital-to-analog converter identical to the digital-to-analog converter; and
a DAC assist path gain stage coupled at its input to an output of the replica digital-to-analog converter and at its output to the output terminal and configured to inject a current from the DAC assist gain stage into the output terminal.

7. A method comprising, in a two-stage feedforward compensated operational transconductance integrated amplifier, the two-stage feedforward compensated operational transconductance integrated amplifier comprising an input terminal, an output terminal, and a signal path between the input terminal and the output terminal, and the signal path having a first signal path gain stage and a second signal path gain stage:
coupling ripple rejection circuitry between the input terminal and an intermediate node of the signal path located between the first signal path gain stage and the second signal path gain stage, the ripple rejection circuitry comprising:
a first ripple rejection circuitry gain stage coupled at its input to the input terminal and coupled at its output to an input terminal of a chopper circuit;
a notch filter coupled at its input to an output terminal of the chopper circuit; and
a second ripple rejection circuitry gain stage coupled at its input to an output terminal of the notch filter and coupled at its output to the intermediate node;
coupling a filter at its output to the input terminal of the two-stage feedforward compensated operational transconductance integrated amplifier, wherein the filter is configured to receive an input signal and generate a filtered input signal to the input terminal of the two-stage feedforward compensated operational transconductance integrated amplifier;
coupling a digital-to-analog converter at its output to the input terminal of the two-stage feedforward compensated operational transconductance integrated amplifier, wherein the digital-to-analog converter is configured to receive a digital signal and generate an equivalent analog signal to the input terminal of the two-stage feedforward compensated operational transconductance integrated amplifier; and
coupling a signal assist path gain stage at its input to the filter and coupling the signal assist path at its output to the output terminal, wherein the signal assist path is configured to inject a current from the filter into an integrating capacitor of the two-stage feedforward compensated operational transconductance integrated amplifier.

8. The method of claim 7, further comprising coupling a DAC assist path gain stage at its input to an output of a replica digital-to-analog converter identical to the digital-to-analog converter and coupling the DAC assist path at its output to the output terminal, wherein the DAC assist path is configured to inject a current from the DAC assist gain stage into the output terminal of the two-stage feedforward compensated operational transconductance integrated amplifier.

9. A method comprising, in a two-stage feedforward compensated operational transconductance integrated amplifier, the two-stage feedforward compensated operational transconductance integrated amplifier comprising an input terminal, an output terminal, and a signal path between the input terminal and the output terminal, and the signal path having a first signal path gain stage and a second signal path gain stage:
coupling ripple rejection circuitry between the input terminal and an intermediate node of the signal path located between the first signal path gain stage and the second signal path gain stage, the ripple rejection circuitry comprising:
a first ripple rejection circuitry gain stage coupled at its input to the input terminal and coupled at its output to an input terminal of a chopper circuit;
a notch filter coupled at its input to an output terminal of the chopper circuit; and
a second ripple rejection circuitry gain stage coupled at its input to an output terminal of the notch filter and coupled at its output to the intermediate node;
coupling a filter at its output coupled to the input terminal of the two-stage feedforward compensated operational transconductance integrated amplifier, wherein the filter is configured to receive an input signal and generate a filtered input signal to the input terminal of the two-stage feedforward compensated operational transconductance integrated amplifier;
coupling a digital-to-analog converter at its output to the input terminal of the two-stage feedforward compensated operational transconductance integrated amplifier, wherein the digital-to-analog converter is configured to receive a digital signal and generate an equivalent analog signal to the input terminal of the two-stage feedforward compensated operational transconductance integrated amplifier; and
coupling a DAC assist path gain stage at its input to an output of a replica digital-to-analog converter identical to the digital-to-analog converter and coupling the DAC assist path at its output to the output terminal, wherein the DAC assist path is configured to inject a current from the DAC assist gain stage into the output terminal of the two-stage feedforward compensated operational transconductance integrated amplifier.

10. A method comprising:
coupling a filter at its output coupled to an input terminal of an amplifier, wherein the filter is configured to receive an input signal and generate a filtered input signal to the input terminal;
coupling a digital-to-analog converter at its output coupled to the input terminal, wherein the digital-to-analog converter is configured to receive a digital signal and generate an equivalent analog signal to the input terminal; and
coupling a signal assist path gain stage at its input to the filter and coupling the signal assist path gain stage at its output to an output terminal of the amplifier, wherein the signal assist path gain stage is configured to inject a current from the filter into an integrating capacitor of the amplifier.

11. The method of claim 10, further comprising coupling a DAC assist path gain stage at its input to an output of a replica digital-to-analog converter identical to the digital-to-analog converter and coupling the DAC assist path at its output to the output terminal, wherein the DAC assist path is configured to inject a current from the DAC assist gain stage into the output terminal.

12. A method comprising:
coupling a filter at its output to an input terminal of an amplifier, wherein the filter is configured to receive an input signal and generate a filtered input signal to the input terminal;

coupling a digital-to-analog converter at its output to the input terminal, wherein the digital-to-analog converter is configured to receive a digital signal and generate an equivalent analog signal to the input terminal; and coupling a DAC assist path gain stage at its input to an output of a replica digital-to-analog converter identical to the digital-to-analog converter and coupling the DAC assist path at its output to the output terminal, wherein the DAC assist path is configured to inject a current from the DAC assist gain stage into the output terminal.

* * * * *